(12) United States Patent
Tsao et al.

(10) Patent No.: US 10,084,266 B1
(45) Date of Patent: Sep. 25, 2018

(54) RECHARGING CABLE

(71) Applicant: LYRA SEMICONDUCTOR INCORPORATED, Hsinchu County (TW)

(72) Inventors: Hung-Chang Tsao, Hsinchu County (TW); Kun-Huang Tsai, Hsinchu County (TW)

(73) Assignee: LYRA SEMICONDUCTOR INCORPORATED, Hsinchu County (TW)

( * ) Notice: Subject to any disclaimer, the term of this patent is extended or adjusted under 35 U.S.C. 154(b) by 0 days.

(21) Appl. No.: 15/710,880

(22) Filed: Sep. 21, 2017

(30) Foreign Application Priority Data

Sep. 4, 2017 (TW) .............................. 106130115 A

(51) Int. Cl.
| | |
|---|---|
| *G01R 27/16* | (2006.01) |
| *H01R 13/66* | (2006.01) |
| *G01R 31/08* | (2006.01) |
| *H02J 7/00* | (2006.01) |
| *H01R 24/28* | (2011.01) |
| *H01R 107/00* | (2006.01) |

(52) U.S. Cl.
CPC ......... *H01R 13/6683* (2013.01); *G01R 27/16* (2013.01); *G01R 31/088* (2013.01); *H01R 24/28* (2013.01); *H02J 7/0045* (2013.01); *H01R 2107/00* (2013.01)

(58) Field of Classification Search
CPC ....................................................... G01R 27/16
USPC ............................................. 307/103; 322/21
See application file for complete search history.

(56) References Cited

U.S. PATENT DOCUMENTS

| | | | | |
|---|---|---|---|---|
| 8,035,254 B2 * | 10/2011 | Djenguerian | ..... | H02M 3/33523 307/103 |
| 2010/0181840 A1 * | 7/2010 | Coulson | ..... | H02J 1/00 307/103 |
| 2015/0333514 A1 * | 11/2015 | Wang | ..... | H02J 1/14 307/103 |
| 2016/0172874 A1 * | 6/2016 | Hsu | ..... | G06F 1/28 320/107 |
| 2016/0195578 A1 * | 7/2016 | Huang | ..... | G01R 27/14 320/134 |
| 2016/0241406 A1 * | 8/2016 | Darshan | ..... | H04L 12/10 |
| 2018/0109118 A1 * | 4/2018 | Sun | ..... | H02J 7/04 |

* cited by examiner

*Primary Examiner* — Fritz M Fleming
(74) *Attorney, Agent, or Firm* — Lin & Associates IP, Inc.

(57) ABSTRACT

A recharging cable is disclosed, applicable to a smart recharging environment capable of self-detection and self-diagnosis, comprising: a cable; a plug, coupled to the cable, and having at least a power line set, and at least a communication line set, the at least power line set having a power line and a ground line, and the at least communication line set providing real-time communication between the recharging cable and a charging control end and a charged end; an electronic chip, located at one of the cable and the plug, the electronic chip being able to detect real-time information of the material property and device property at the charged end to estimate a real-time impedance information of the cable, and in combination with a historic impedance changes of the cable, to estimate an impedance reflection point of the cable related to ageing.

6 Claims, 5 Drawing Sheets

RECHARGING CABLE

CROSS-REFERENCE TO RELATED APPLICATION

The present application is based on, and claims priority form, Taiwan Patent Application No. 106130115, filed Sep. 4, 2017, the disclosure of which is hereby incorporated by reference herein in its entirety.

TECHNICAL FIELD

The technical field generally relates to a recharging cable, and in particular, to a recharging cable applicable to a smart recharging environment capable of self-detection and self-diagnosis, able to detect real-time voltage and current information of the material property so as to facilitate the charging source end to improve charging efficiency in accordance with the charged device at the sink end, to estimate a real-time impedance information of the cable, and in combination with a historic impedance changes of the cable, to estimate an impedance reflection point of the cable related to ageing, to provide subsequent protection mechanism and charging efficiency, and to notify cable replacement based on self-diagnosis.

BACKGROUND

The conventional charging cable does not include built-in self-detection capability. However, in the fast charging application, the large-current charging is becoming a trend. Under large-current charging, the recharging cable ages faster and causes increase in the recharging cable. Moreover, the cable may dissipate heat due to increased impedance under large-current charging and the cable is prone to melting cause short-circuit and leading to great potential hazard.

Furthermore, the conventional recharging cable does not include capabilities of self-diagnosis and storage of historic impedance changes. The source end for charging neither knows the loss condition of the recharging cable to estimate the reflection point of ageing, nor able to estimate the over-heating risk of the cable. The cable is unable to notify the user for future replacement of the cable. For charging efficiency, the source end is unable to perform efficiency charging based on the real-time impedance-temperature characteristics and perform appropriate calibration accordingly.

Taiwan Patent Number I571022 "Electronic Device with Circuitry to Detect the Insertion Orientation of a Plug Connector and Related Method" is related to I/O of an audio connector and data connector, and discloses a bi-directional connector, having a connector protruding part with a first and a second main sides disposed opposite to each other, and a plurality of electric contact points carried on the connector protruding part. The plurality of contact points comprises a plurality of first contact points formed on the first main side and a plurality of second contact points formed on the second main side. The plurality of first contact points and the plurality of second contact points are symmetrically separated, and the connector protruding part is molded for exhibit 180° symmetry so that the connector protruding part can be inserted in one of two insertion orientations and operatively coupled to a corresponding slot connector.

Taiwan Patent Number I563365 "Device Charging over USB Using a Plurality of Handshakes" is related to charging the device by using a plurality of handshakes. A first device can provides a first handshake to a second device. A device of the first device type can be configured to charge the battery based on the first handshake under the circumstance of lack of further communication. The first device can monitor a connection to the second device for a second handshake corresponding to a device of the second device type. In response to detecting the second handshake, the first device can provide a response to the second device. Correspondingly, the second device of the second device type can be configured to charge the battery based on the second handshake.

Taiwan Patent Number I560955 "Breakaway Mechanism for Charging Cables of Electric Vehicle Charging Stations" discloses a breakaway mechanism for charging cable of electric vehicle charging stations, comprising: a fixation assembly and a breakaway assembly. The fixation assembly is to fix to the charging station and the breakaway assembly is to fix to the charging cable. The charging cable passes through the breakaway assembly and comprises the charging cable connected to the connector of the charging station. The breakaway assembly can be adjusted to disengage from the fixation assembly under a default pull force so as to break the connection between the charging cable and the connector of the charging station.

Taiwan Patent Number I479755 "Charging Cable Plug for Connecting Electric Vehicle to a Charging Station" discloses a charging cable plug for connecting electric vehicle to a charging station. The plug device comprises a shell for connecting to the electric vehicle or electric contact point of a connection device, which is connected to the shell, of the charging station, and a code writing device disposed inside the shell for amp value of current transmitted by the charging cable. The invention is further related to a system comprising a charging cable and a charging station and/or an electric vehicle and a charging cable with the plug device. The purpose of the invention is to provide higher safety for over-heating. The objects of the invention comprise: a code writing device disposed inside the shell for amp value of current transmitted by the charging cable, a temperature detection device disposed at the shell, an evaluation device for calculating a value of a temperature calibration code, and a communication device for transmitting to a charging current control device.

In addition, the conventional recharging cable only concerns the interface specification for charging, such as, USB interface, with neither consulting the characteristics of the device at the sink end that receives the charging, such as, the battery characteristics of the electronic device, nor power-saving. The role played by the recharging cable is only to provide the voltage/current required for charging between the source end and the sink end. The recharging cable is unable to take into account the battery characteristics of the electronic device and power-saving criterion to perform more efficient charging. Also, the recharging cable cannot perform voltage/current detection on the source end and the sink end for more efficient charging.

In other words, for the conventional recharging cable, many issues, such as, how to perform collaborative computation based on the detected real-time voltage, current, temperature information, and device under charge to estimate a real-time cable impedance information; how to provide the detected real-time voltage/current to the source end to facilitate the source end to perform efficient charging based on the device characteristics under charging; how to take into account the current over-loading and over-heating risk to adjust charging current/voltage to provide better protection to the charging cable and extend the life span of the cable, how to estimate a real-time impedance information of the cable, in combination with non-volatile storage of historic impedance data of the cable to estimate the reflection point of impedance caused by cable ageing to provide subsequent protection mechanism and improve charging efficiency to notify for cable replacement based on self-diagnosis result, are imperative objects to be addressed.

SUMMARY

The primary object of the present invention is to provide a recharging cable, applicable to a smart recharging environment capable of self-detection and self-diagnosis, when used between a source end and a sink end for charging, the recharging cable being capable of performing collaborative computation based on the detected real-time voltage, current, temperature information, and device under charge to estimate a real-time cable impedance information; providing the detected real-time voltage/current to the source end to facilitate the source end to perform efficient charging based on the device characteristics under charging; taking into account the current over-loading and over-heating risk to adjust charging current/voltage to provide better protection to the charging cable and extend the life span of the cable, estimating a real-time impedance information of the cable, in combination with non-volatile storage of historic impedance data of the cable to estimate the reflection point of impedance caused by cable ageing to provide subsequent protection mechanism and improving charging efficiency to notify for cable replacement based on self-diagnosis result.

Another object of the present invention is to provide a recharging cable, applicable to a smart recharging environment capable of self-detection and self-diagnosis, capable of self-detection and self-diagnosis to enhance the safety of the recharging cable and extend the life span, as well as improve identifiability of the recharging cable and charging efficiency, and able to provide historic information on the cable, real-time-temperature information to enhance the charging efficiency and safety.

Yet another object of the present invention is to provide a recharging cable, applicable to a smart recharging environment capable of self-detection and self-diagnosis, able to provide manufacturing and historic information so that the cable being able to predict the deterioration rate at the beginning to improve cable reliability and safety so that the entire charging system being able to provide more efficient charging based on the device characteristics under charging.

To achieve the above objects, the present invention provides a recharging cable interfacing between a source end for charging and a sink end for connecting a device under charging, the recharging cable comprising: a plug, an integrated circuit (IC) chip, and a cable; wherein the IC chip being located inside the plug or the cable.

IC chip: the IC chip is able to perform collaborative computation based on the detected real-time voltage, current, and temperature information, and characteristics of a device under charge to estimate a real-time cable impedance information; the IC chip provides detected real-time voltage/current to the source end to facilitate the source end to perform efficient charging based on the device characteristics under charging; takes into account current over-loading and over-heating risk to adjust charging current/voltage to provide better protection to the charging cable and extend the life span of the cable, estimates a real-time impedance information of the cable, in combination with non-volatile storage of historic impedance data of the cable to estimate the reflection point of impedance caused by cable ageing to provide subsequent protection mechanism and improving charging efficiency to notify for cable replacement based on self-diagnosis result.

In addition, depending on actual application, the IC chip of the recharging cable of the present invention can be used in combination with a stress sensor to perform integrated computation based on detected real-time voltage, current, temperature information, and characteristics of the device under charging as well as stress to estimate a real-time impedance information for suitable adjustment of the charging current/voltage.

The foregoing will become better understood from a careful reading of a detailed description provided herein below with appropriate reference to the accompanying drawings.

BRIEF DESCRIPTION OF THE DRAWINGS

The embodiments can be understood in more detail by reading the subsequent detailed description in conjunction with the examples and references made to the accompanying drawings, wherein.

DETAILED DESCRIPTION OF THE DISCLOSED EMBODIMENTS

Figure 1:
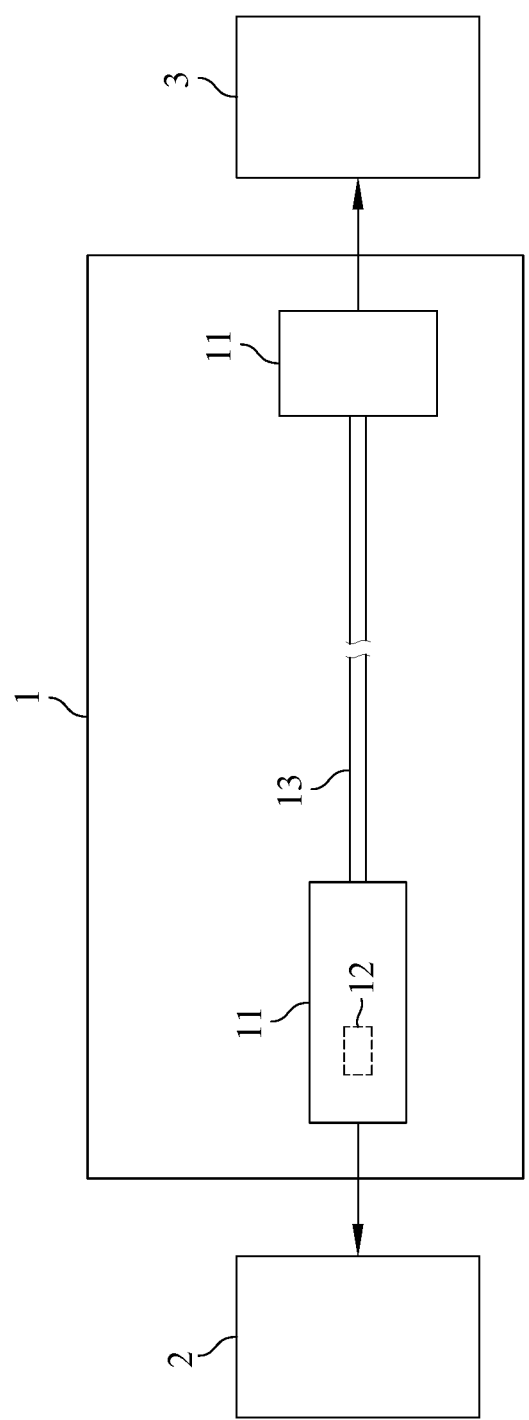
FIG. 1 shows a schematic view of the structure of the recharging cable of the present invention and the operation between the source end and the sink end.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 shows a schematic view of the structure of the recharging cable of the present invention and the operation between the source end and the sink end. As shown in FIG. 1, the recharging cable 1 interfaces between a source end 2 providing charging and a sink end 3 connected to a device under charging. The recharging cable 1 comprises a plug 11, an integrated circuit (IC) chip 12, and a cable 13, wherein the IC chip 12 being located inside the plug 11 or the cable 13.

Plug 11: the plug 11 is coupled to the cable 13, the plug 11 comprises at least a power cable set (not shown) and at least a communication cable set (not shown); the at least a power cable set comprises a power line and a ground line, and the at least a communication cable set provides real-time communication capability between the recharging cable 1 and the source end 2 and the sink end 3.

IC chip 12: the IC chip 12 is located inside the plug 11 or inside the cable 13. The IC chip 12 is able to perform collaborative computation based on the detected real-time voltage, current, and temperature information (not shown) of the cable 13, and characteristics of a device under charge to estimate a real-time impedance information of the cable 13; the IC chip 12 provides detected real-time voltage/current of the cable 13 to the source end 2 through the plug 11 to facilitate the source end 2 to perform efficient charging to the device at the sink end 3 based on the device characteristics under charging; the IC chip 12 takes into account current over-loading and over-heating risk to adjust charging current/voltage to provide better protection to the charging cable and extend the life span of the cable, estimates a real-time impedance information of the cable 13, in combination with non-volatile storage of historic impedance data of the cable 13 to estimate the reflection point of impedance caused by cable ageing to provide subsequent protection mechanism and improving charging efficiency to notify for cable 13 replacement based on self-diagnosis result.

In addition, depending on actual application, the IC chip 12 of the recharging cable 1 of the present invention can be used in combination with a stress sensor (not shown) to perform integrated computation based on detected real-time voltage, current, temperature information, and characteristics of the device under charging as well as stress to estimate a real-time impedance information of the cable 13 for suitable adjustment of the charging current/voltage.

In actual application, the source end 2 can be, such as, a charging stand for a vehicle and/or a charging cable with communication interface. For example, with USB interface, the source end 2 is a recharger with a USB connector or a charging stand. For another example, with Apple Lightening Cable as a recharging cable, the source end 2 is a recharger with a Lightening Cable connector or a charging stand. As such, the source end 2 or the cable 13 with self-detection can notify the user of replacing the cable 13. Moreover, the cable 13 can also notify the sink end based on the impedance change trend, device characteristics of the device under charging, changes in voltage or current so as to improve charging efficiency. Also, the temperature change in the cable 13 is considered to reduce or shut down the current to prevent the cable 13 from over-heating to result in short circuit.

Figure 2:
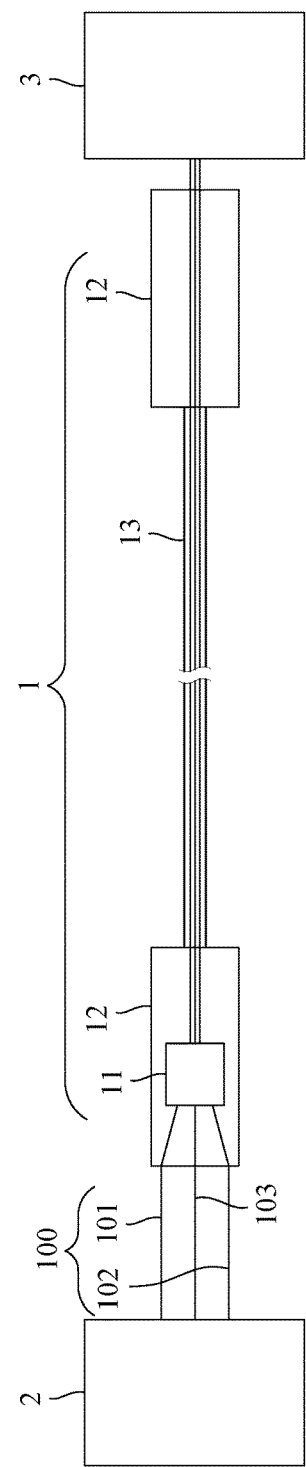
FIG. 2 shows a schematic view of the structure of an embodiment of the recharging cable of the present invention and the operation between the source end and the sink end.

FIG. 2 is a schematic view showing the structure of the recharging cable of an embodiment of the present invention, when operating with a source and a sink end. As shown in FIG. 2, the recharging cable 1 interfaces between a source end 2 providing charging and a sink end 3 connected to a device under charging. The recharging cable 1 comprises a plug 11, an integrated circuit (IC) chip 12, and a cable 13, wherein the IC chip 12 being located inside the plug 11.

Plug 11: the plug 11 is coupled to the cable 13, the plug 11 comprises at least a power cable set 100 and at least a communication cable set 103; the at least a power cable set 100 comprises a power line 101 and a ground line 102, and the at least a communication cable set 103 provides real-time communication capability between the recharging cable 1 and the source end 2 and the sink end 3.

IC chip 12: the IC chip 12 is located inside the plug 11.

In actual application, the source end 2 can be a charging cable with communication interface, such as USB interface. With USB interface, the source end 2 is a recharger with a USB connector or a charging stand. FAs such, the source end 2 or the cable 13 with self-detection can notify the user of replacing the cable 13. Moreover, the cable 13 can also notify the sink end 3 based on the impedance change trend, device characteristics of the device under charging, changes in voltage or current so as to improve charging efficiency. Also, the temperature change in the cable 13 is considered to reduce or shut down the current to prevent the cable 13 from over-heating to result in short circuit.

Figure 3:
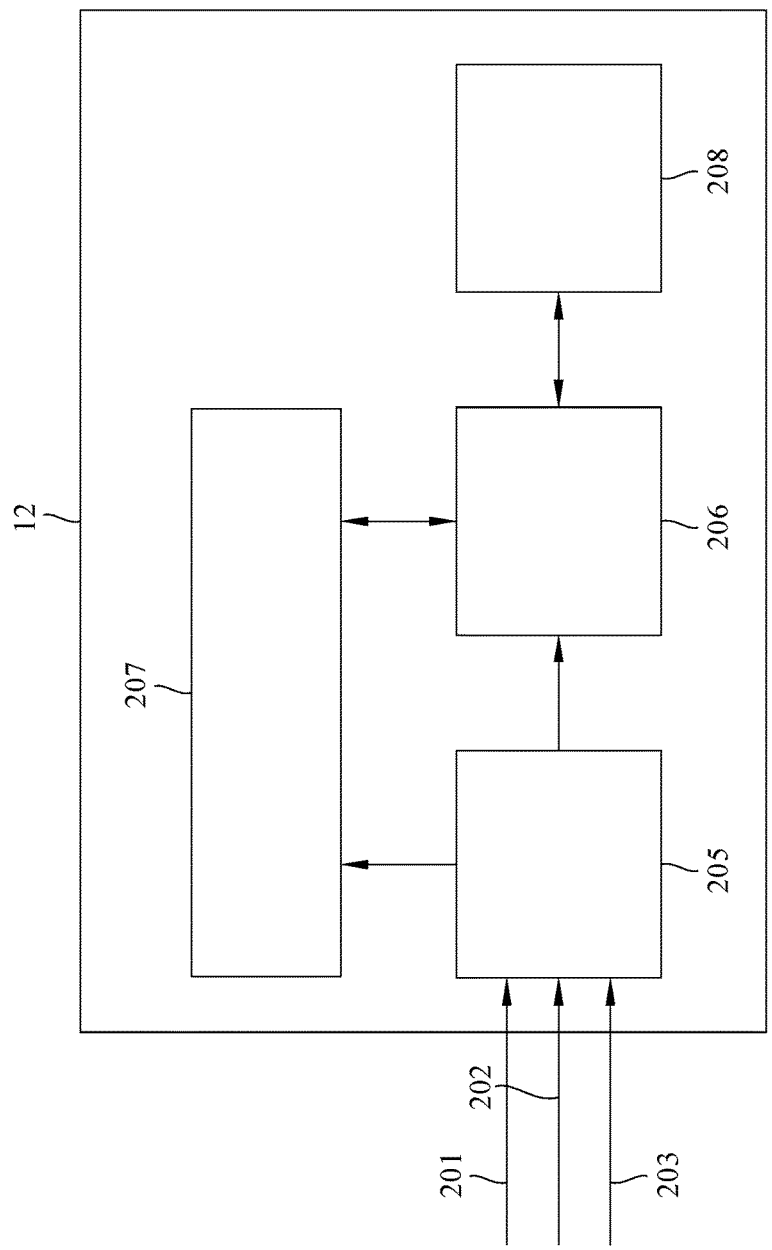
FIG. 3 shows a schematic view of the structure of the IC chip in FIG. 2.

FIG. 3 is a schematic view showing the structure of the IC chip in FIG. 2. As shown in FIG. 3, the IC chip 12 comprises an analog-to-digital converter (ADC) 205, a computation module 206, a non-volatile memory 207, and a communication interface 208.

ADC 205: the ADC 205 detects a cable temperature signal 201 of the cable 13, a cable current/voltage signal 202 of the cable 13, and a cable current/voltage signal 203 of the cable 13, wherein the cable temperature signal 201 can be at least a set of temperature signals, the cable current/voltage signal 202 can be at least a set of current/voltage signals, and the cable current/voltage signal 203 can be a t least a set of current/voltage signals. The ADC 205 can detect real-time cable impedance and temperature change, and converts the cable temperature signal 201 of the cable, the cable current/voltage signal 202, and the cable current/voltage signal 203 into digital signals to provide to subsequent computation module 206 for signal processing.

Computation module 206: the computation module 206 can be a special-purpose circuit or processor, for performing collaborative computation on the real-time voltage, current and temperature information obtained from the ADC 205 and the characteristics of the device under charging at the sink end 3 to estimate a real-time cable impedance information (data and impedance value) of the cable 13 and store to the non-volatile memory 207 for forming a historic record data. The historic record data will be provided to the computation module 206 for computation and prediction of cable impedance ageing in the cable 13, as well as, collaboration with current/voltage of efficient charging to reduce current or cut off current to avoid over-current.

In other words, the computation module 206 provides detected real-time voltage/current of the cable 13 to the source end 2 through the communication interface 208 to facilitate the source end 2 to perform efficient charging to the device at the sink end 3 based on the device characteristics under charging; the computation module 206 takes into account current over-loading and over-heating risk to adjust charging current/voltage to provide better protection to the charging cable and extend the life span of the cable, estimates a real-time impedance information of the cable 13, in combination with non-volatile storage of historic impedance data of the cable 13 to estimate the reflection point of impedance caused by cable ageing to provide subsequent protection mechanism and improving charging efficiency to notify for cable 13 replacement based on self-diagnosis result.

Non-volatile memory 207: the non-volatile memory 207 stores the historic record data of the cable impedance changes of the cable 13 and provides storage to burn serial number, type, power limit, shipping impedance value and shipping date as well as, recording operation duration and usage date of the cable 13, impedance change, operation temperature for providing to the computation module 206 to estimate the transmission loss.

Communication interface 208: the computation module 206 provides detected real-time voltage/current of the cable 13 from the ADC 205 to the source end 2 through the communication interface 208 to facilitate the source end 2 to perform efficient charging to the device at the sink end 3 based on the device characteristics under charging; the computation module 206 takes into account current over-loading and over-heating risk to adjust charging current/voltage to provide better protection to the charging cable and extend the life span of the cable, estimates a real-time impedance information of the cable 13, in combination with non-volatile storage of historic impedance data of the cable 13 to estimate the reflection point of impedance caused by cable ageing to provide subsequent protection mechanism and improving charging efficiency to notify for cable 13 replacement based on self-diagnosis result.

Figure 4:
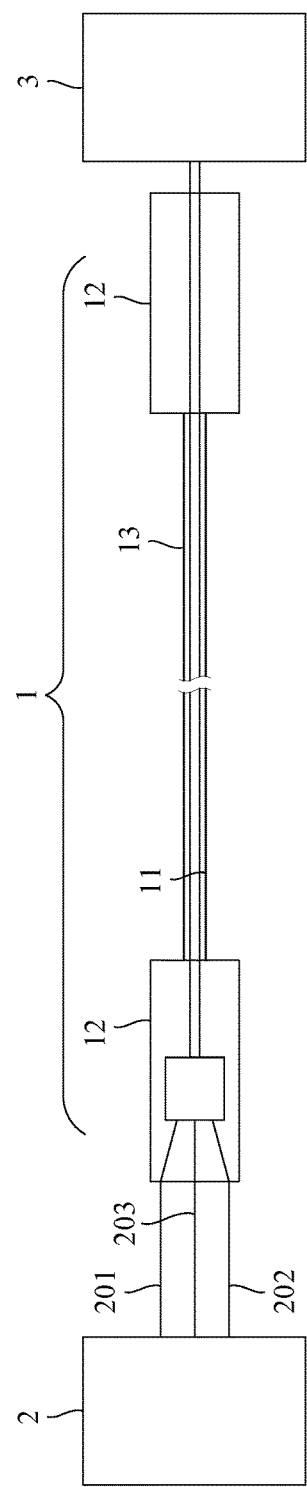
FIG. 4 shows a schematic view oft the structure of another embodiment of the recharging cable of the present invention and the operation between the source end and the sink end.

FIG. 4 shows a schematic view showing the structure of the recharging cable of another embodiment of the present invention, when operating with a source and a sink end. As shown in FIG. 4, the recharging cable 1 interfaces between a source end 2 providing charging and a sink end 3 connected to a device under charging. The recharging cable 1 comprises a plug 11, an integrated circuit (IC) chip 12, and a cable 13, wherein the IC chip 12 being located inside the cable 13.

Plug 11: the plug 11 is coupled to the cable 13, the plug 11 comprises at least a power cable set 100 and at least a communication cable set 103; the at least a power cable set 100 comprises a power line 101 and a ground line 102, and the at least a communication cable set 103 provides real-time communication capability between the recharging cable 1 and the source end 2 and the sink end 3.

IC chip 12: the IC chip 12 is located inside the cable 13.

When the present embodiment is implemented, the source end 2 can be a charging stand for a vehicle. As such, the source end 2 or the cable 13 with self-detection can notify the user of replacing the cable 13. Moreover, the cable 13 can also notify the sink end based on the impedance change trend, device characteristics of the device under charging, changes in voltage or current so as to improve charging efficiency. Also, the temperature change in the cable 13 is considered to reduce or shut down the current to prevent the cable 13 from over-heating to result in short circuit.

Figure 5:
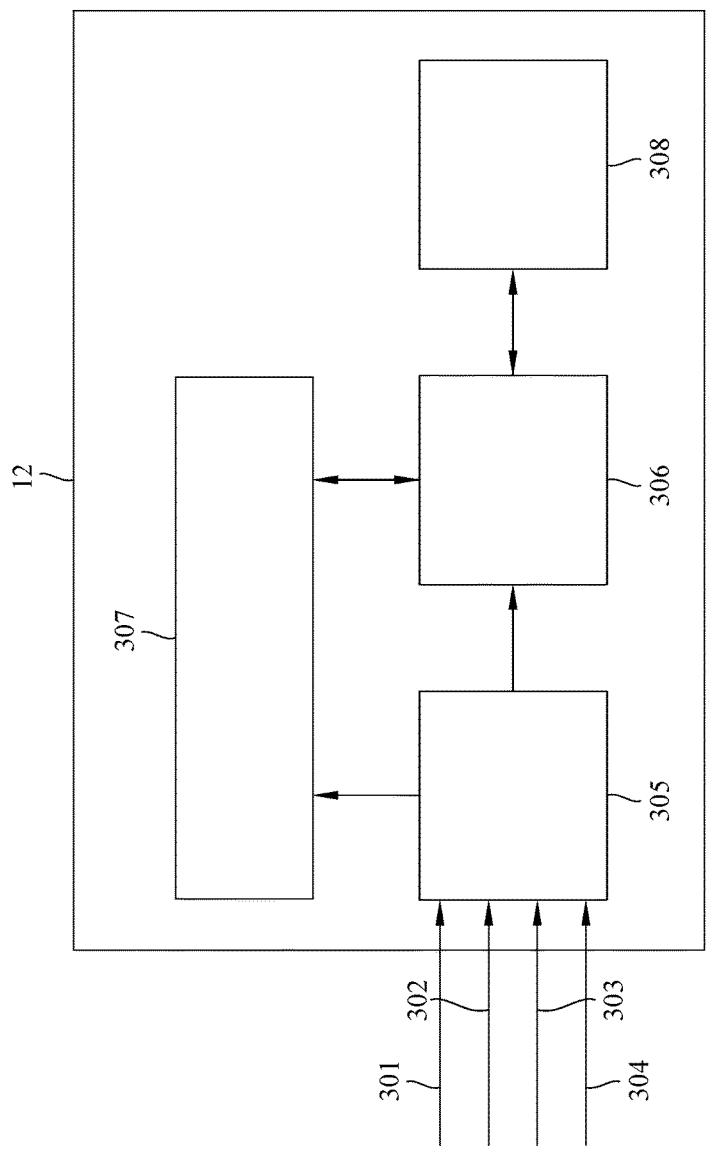
FIG. 5 shows a schematic view of the structure of the IC chip in FIG. 4.

FIG. 5 is a schematic view showing the IC chip 12 in FIG. 4. As shown in FIG. 5, the IC chip 12 comprises an ADC 305, a computation module 306, a non-volatile memory 307, and a communication interface 308.

ADC 305: the ADC 305 detects a cable temperature signal 301 of the cable 13, a cable current/voltage signal 302 of the cable 13, a cable current/voltage signal 303 of the cable 13, and a cable stress signal 304; in other words, the ADC 305 not only detects the voltage, current, temperature change real-time information, but also the stress change real-time information, wherein the cable temperature signal 301 can be at least a set of temperature signals, the cable current/voltage signal 302 can be at least a set of current/voltage signals, the cable current/voltage signal 303 can be a t least a set of current/voltage signals, and the cable stress signal 304 can be at least a set of stress signals. The stress will cause increase in impedance when the cable 13 is bended inappropriately. The ADC 305 can detect real-time cable impedance and temperature change, and converts the cable temperature signal 301 of the cable 13, the cable current/voltage signal 302, a the cable current/voltage signal 303, and the cable stress signal 304 into digital signals to provide to subsequent computation module 206 for signal processing.

Computation module 306: the computation module 306 can be a special-purpose circuit or processor, for performing collaborative computation on the real-time voltage, current, temperature, and stress information obtained from the ADC 305 and the characteristics of the device under charging at the sink end 3 to estimate a real-time cable impedance information (data and impedance value) of the cable 13 and store to the non-volatile memory 307 for forming a historic record data. The historic record data will be provided to the computation module 306 for computation and prediction of cable impedance ageing in the cable 13, as well as, collaboration with current/voltage of efficient charging to reduce current or cut off current to avoid over-current.

In other words, the computation module 306 provides detected real-time voltage/current of the cable 13 to the source end 2 through the communication interface 208 to facilitate the source end 2 to perform efficient charging to the device at the sink end 3 based on the device characteristics under charging; the computation module 306 takes into account current over-loading and over-heating risk to adjust charging current/voltage to provide better protection to the charging cable and extend the life span of the cable, estimates a real-time impedance information of the cable 13, in combination with non-volatile storage of historic impedance data of the cable 13 to estimate the reflection point of impedance caused by cable ageing to provide subsequent protection mechanism and improving charging efficiency to notify for cable 13 replacement based on self-diagnosis result.

Non-volatile memory 307: the non-volatile memory 307 stores the historic record data of the cable impedance changes of the cable 13 and provides storage to burn serial number, type, power limit, shipping impedance value and shipping date as well as, recording operation duration and usage date of the cable 13, impedance change, operation temperature for providing to the computation module 306 to estimate the transmission loss.

Communication interface 308: the computation module 306 provides detected real-time voltage/current of the cable 13 from the ADC 205 to the source end 2 through the communication interface 308 to facilitate the source end 2 to perform efficient charging to the device at the sink end 3 based on the device characteristics under charging; the computation module 306 takes into account current over-loading and over-heating risk to adjust charging current/voltage to provide better protection to the charging cable and extend the life span of the cable, estimates a real-time impedance information of the cable 13, in combination with non-volatile storage of historic impedance data of the cable 13 to estimate the reflection point of impedance caused by cable ageing to provide subsequent protection mechanism and improving charging efficiency to notify for cable 13 replacement based on self-diagnosis result.

Also, in the present embodiment, the IC chip 12 of the recharging cable 1 can be used in combination with a stress sensor (not shown) to perform integrated computation based on detected real-time voltage, current, temperature information, and characteristics of the device under charging as well as stress to estimate a real-time impedance information of the cable 13 for suitable adjustment of the charging current/voltage.

The components of the recharging cable of the present invention shown in the embodiment of FIG. 2 and embodiment of FIG. 4 cab be opted or combined to achieve similar results, and the details will not be repeated here.

Moreover, in actual application, the plug or the cable of the recharging cable is embedded with an IC chip with capability of detection, measurement, computation, and a non-volatile memory for storage, wherein the detection and measurement is performed by the ADC, the computation is performed by application-specific IC (ASIC) or programmable processor, such as MCU or DSP, and the non-volatile memory for storage can be flash or EEPROM/MTP, and so on. The IC chip with the above functions provides storage to burn serial number, type, power limit, shipping impedance value and shipping date as well as, records operation duration and usage date of the cable, impedance change, operation temperature for estimating the transmission loss. The result is provided through communication interface to the source end to inform the source end of the reflection point in the ageing of the cable based on the recorded data.

In summary, the recharging cable of the present invention is applicable to a smart recharging environment capable of self-detection and self-diagnosis when used between a source end and a sink end for charging. The recharging cable is capable of performing collaborative computation based on the detected real-time voltage, current, temperature information, and device under charge to estimate a real-time cable impedance information; providing the detected real-time voltage/current to the source end to facilitate the source end to perform efficient charging based on the device characteristics under charging; taking into account the current over-loading and over-heating risk to adjust charging current/voltage to provide better protection to the charging cable and extend the life span of the cable, estimating a real-time impedance information of the cable, in combination with non-volatile storage of historic impedance data of the cable to estimate the reflection point of impedance caused by cable ageing to provide subsequent protection mechanism and improving charging efficiency to notify for cable replacement based on self-diagnosis result. The recharging cable of the present invention provides the following advantages:

1. capable of performing collaborative computation based on the detected real-time voltage, current, temperature information, and device under charge to estimate a real-time cable impedance information; providing the detected real-time voltage/current to the source end to facilitate the source end to perform efficient charging based on the device characteristics under charging; taking into account the current over-loading and over-heating risk to adjust charging current/voltage to provide better protection to the charging cable and extend the life span of the cable, estimating a real-time impedance information of the cable, in combination with non-volatile storage of historic impedance data of the cable to estimate the reflection point of impedance caused by cable ageing to provide subsequent protection mechanism and improving charging efficiency to notify for cable replacement based on self-diagnosis result.

2. capable of self-detection and self-diagnosis to enhance the safety of the recharging cable and extend the life span, as well as improve identifiability of the recharging cable and charging efficiency, and able to provide historic information on the cable, real-time-temperature information to enhance the charging efficiency and safety.

3. able to provide manufacturing and historic information so that the cable being able to predict the deterioration rate at the beginning to improve cable reliability and safety so that the entire charging system being able to provide more efficient charging based on the device characteristics under charging.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A recharging cable, applicable to a smart recharging environment capable of self-detection and self-diagnosis, comprising:
    a cable;
    a plug, coupled to the cable, comprising at least a power cable set and at least a communication cable set, the at least power cable set comprising a power line and a ground line, and the at least communication cable set providing communication capability to the recharging cable with a source end for charging and a sink end for connecting to a device under charging; and
    an integrated circuit (IC) chip, located in the plug or the cable, for detecting real-time information of changes in voltage, current and temperature in the cable and characteristics of the device under charging at the sink end, performing collaborative computation to estimate a real-time cable impedance information of the cable, in combination with historic data of the cable impedance change of the cable to predict an impedance reflection point of cable caused by ageing.

2. A recharging cable, applicable to a smart recharging environment capable of self-detection and self-diagnosis, comprising:
    a cable;
    a plug, coupled to the cable, comprising at least a power cable set and at least a communication cable set, the at least power cable set comprising a power line and a ground line, and the at least communication cable set providing communication capability to the recharging cable with a source end for charging and a sink end for connecting to a device under charging; and
    an integrated circuit (IC) chip, located in the plug or the cable, for detecting real-time information of changes in voltage, current, temperature and stress in the cable and characteristics of the device under charging at the sink end, performing collaborative computation to estimate a real-time cable impedance information of the cable, in combination with historic data of the cable impedance change of the cable to predict an impedance reflection point of cable caused by ageing.

3. A recharging cable, applicable to a smart recharging environment capable of self-detection and self-diagnosis, comprising:
    a cable;
    a plug, coupled to the cable, comprising at least a power cable set and at least a communication cable set, the at least power cable set comprising a power line and a ground line, and the at least communication cable set providing communication capability to the recharging cable with a source end for charging and a sink end for connecting to a device under charging; and
    an integrated circuit (IC) chip, located in the plug or the cable, comprising: an analog-to-digital converter (ADC), a computation module, a non-volatile memory, and a communication interface; wherein,
    the ADC being for detecting real-time information of changes in voltage, current and temperature in the cable;
    the computation module being for, based on the real-time information of changes in voltage, current and temperature in the cable from the ADC and characteristics of the device under charging at the sink end, performing collaborative computation to estimate a real-time cable impedance information of the cable and storing to the non-volatile memory; after the computation module estimating the real-time cable impedance information of the cable, in combination with historic data of the cable impedance change of the cable, the computation module predicting an impedance reflection point of cable caused by ageing; and
    through the communication interface, the computation module provides the real-time information of voltage and current of the cable detected by ADC to the source end for the source end to adjust voltage and current for efficient charging according to the characteristics of the device at the sink end.

4. The recharging cable as claimed in claim 3, wherein the computation module is an application-specific IC (ASIC) or a programmable processor.

5. The recharging cable as claimed in claim 3, wherein the non-volatile memory is one of flash, or EEPROM/MTP.

6. A recharging cable, applicable to a smart recharging environment capable of self-detection and self-diagnosis, comprising:
- a cable;
- a plug, coupled to the cable, comprising at least a power cable set and at least a communication cable set, the at least power cable set comprising a power line and a ground line, and the at least communication cable set providing communication capability to the recharging cable with a source end for charging and a sink end for connecting to a device under charging; and
- an integrated circuit (IC) chip, located in the plug or the cable, comprising: an analog-to-digital converter (ADC), a computation module, a non-volatile memory, and a communication interface; wherein,
- the ADC being for detecting real-time information of changes in voltage, current, temperature, and stress in the cable;
- the computation module being for, based on the real-time information of changes in voltage, current, temperature and stress in the cable from the ADC and characteristics of the device under charging at the sink end, performing collaborative computation to estimate a real-time cable impedance information of the cable and storing to the non-volatile memory; after the computation module estimating the real-time cable impedance information of the cable, in combination with historic data of the cable impedance change of the cable, the computation module predicting an impedance reflection point of cable caused by ageing; and
- through the communication interface, the computation module provides the real-time information of voltage and current of the cable detected by ADC to the source end for the source end to adjust voltage and current for efficient charging according to the characteristics of the device at the sink end.

\* \* \* \* \*